(12) United States Patent
Sleight et al.

(10) Patent No.: US 8,901,659 B2
(45) Date of Patent: Dec. 2, 2014

(54) TAPERED NANOWIRE STRUCTURE WITH REDUCED OFF CURRENT

(75) Inventors: Jeffrey W. Sleight, Ridgefield, CT (US); Sarunya Bangsaruntip, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/369,375

(22) Filed: Feb. 9, 2012

(65) Prior Publication Data

US 2013/0207079 A1    Aug. 15, 2013

(51) Int. Cl.
*H01L 29/66*    (2006.01)

(52) U.S. Cl.
USPC .... 257/365; 257/202; 257/327; 257/E29.028; 257/E29.13; 438/151; 438/157; 438/176; 438/257

(58) Field of Classification Search
None
See application file for complete search history.

(56) References Cited

U.S. PATENT DOCUMENTS

| | | | |
|---|---|---|---|
| 6,706,571 B1 * | 3/2004 | Yu et al. | 438/157 |
| 8,008,146 B2 | 8/2011 | Bangsaruntip et al. | |
| 2005/0121706 A1 * | 6/2005 | Chen et al. | 257/288 |
| 2005/0269629 A1 * | 12/2005 | Lee et al. | 257/327 |
| 2006/0138553 A1 * | 6/2006 | Brask et al. | 257/369 |
| 2007/0164344 A1 * | 7/2007 | Park et al. | 257/314 |
| 2010/0270621 A1 * | 10/2010 | Iwamoto et al. | 257/368 |
| 2011/0133167 A1 | 6/2011 | Bangsaruntip et al. | |

* cited by examiner

*Primary Examiner* — David Vu
*Assistant Examiner* — Cuong B Nguyen
(74) *Attorney, Agent, or Firm* — Scully, Scott, Murphy & Presser, P.C.; H. Daniel Schnurmann

(57) ABSTRACT

Non-planar semiconductor devices including at least one semiconductor nanowire having a tapered profile which widens from the source side of the device towards the drain side of the device are provided which have reduced gate to drain coupling and therefore reduced gate induced drain tunneling currents.

17 Claims, 6 Drawing Sheets

TAPERED NANOWIRE STRUCTURE WITH REDUCED OFF CURRENT

BACKGROUND

The present disclosure relates to semiconductor devices and methods of fabricating the same. More particularly, the present disclosure relates to semiconductor nanowire field effect transistors and methods of fabricating the same.

Non-planar semiconductor devices such as FinFETs, trigates and gate-all around semiconductor nanowire field effect transistors are receiving considerable attention for possible use in extending conventional complementary metal oxide semiconductor (CMOS) scaling. One potential problem area for deeply scaled devices is band to band tunneling (i.e., gate induced drain tunneling or "GIDL" for short) which may limit how low an off current is obtainable for a given device. Low power technologies are particularly impacted by this, as the net off current from the sum of all devices on a chip contributes strongly to overall power consumption.

SUMMARY

Non-planar semiconductor devices including at least one semiconductor nanowire having a tapered profile which widens from the source side of the device towards the drain side of the device are provided which have reduced gate to drain coupling and therefore reduced gate induced drain tunneling currents. More specifically, non-planar semiconductor devices are provided having at least one tapered semiconductor nanowire that has a portion located on a drain side of the gate that is wider relative to another portion of the at least one semiconductor nanowire that is located on the source side of the gate.

In one aspect of the present disclosure, a non-planar semiconductor device is provided having reduced gate to drain coupling and thus reduced gate induced drain tunneling currents. The non-planar semiconductor device includes at least one tapered semiconductor nanowire located atop an insulator layer of a semiconductor-on-insulator substrate. An end segment of the at least one tapered semiconductor nanowire is attached to a first semiconductor-on-insulator pad region and another end segment of the at least one tapered semiconductor nanowire is attached to a second semiconductor-on-insulator pad region. The pad regions are both located atop the insulator layer. The non-planar structure of the present disclosure further includes a gate located on a portion of the at least one tapered semiconductor nanowire, a source region located on a first side of the gate, and a drain region located on a second side of the gate which is opposite the first side of the gate. In accordance with the present disclosure, the at least one tapered semiconductor nanowire comprises a first semiconductor nanowire portion having a first width located on the first side of the gate and a second semiconductor nanowire portion having a second width that is located on the second side of the gate, wherein the second width is greater than the first width.

In another aspect of the present disclosure methods of forming a non-planar semiconductor device having reduced gate to drain coupling and thus reduced gate induced drain tunneling currents is provided. In one embodiment, the method includes forming at least one semiconductor nanowire above an insulator layer of a semiconductor-on-insulator substrate, wherein an end segment of the at least one semiconductor nanowire is attached to a first semiconductor-on-insulator pad region and another end segment of the at least one semiconductor nanowire is attached to a second semiconductor-on-insulator pad region. In accordance with the present disclosure, the pad regions are both located atop the insulator layer. Next, the at least one semiconductor nanowire is formed into at least one tapered semiconductor nanowire including a first semiconductor nanowire portion having a first width, a second semiconductor nanowire portion having a second width and a third semiconductor nanowire portion having a third width, wherein the third semiconductor nanowire portion is located between the first and second semiconductor nanowire portions, and wherein the first width is less than the third width, and the third width is less than the second width. Next, a gate is formed atop the third semiconductor nanowire portion of the at least one tapered semiconductor nanowire. After gate formation, the first semiconductor nanowire portion is located on a first side of the gate and the second semiconductor nanowire portion is located on a second side of the gate that is opposite to the first side. Next, a source region is formed on the first side of the gate and a drain region is formed of the second side of the gate.

In another embodiment, the method includes forming at least one tapered semiconductor nanowire above an insulator layer of a semiconductor-on-insulator substrate, wherein an end segment of the at least one tapered semiconductor nanowire is attached to a first semiconductor-on-insulator pad region and another end segment of the at least one tapered semiconductor nanowire is attached to a second semiconductor-on-insulator pad region. In accordance with the present disclosure, the pad regions are both located atop the insulator layer, and the at least one tapered semiconductor nanowire comprises a first semiconductor nanowire portion having a first width, a second semiconductor nanowire portion having a second width and a third semiconductor nanowire portion having a third width, wherein the third semiconductor nanowire portion is located between the first and second semiconductor nanowire portions, and wherein the first width is less than the third width, and the third width is less than the second width. Next, a gate is formed atop the third semiconductor nanowire portion of the at least one tapered semiconductor nanowire. After gate formation, the first semiconductor nanowire portion is located on a first side of the gate and the second semiconductor nanowire portion is located on a second side of the gate that is opposite to the first side. Next, a source region is formed on the first side of the gate and a drain region is formed of the second side of the gate.

DETAILED DESCRIPTION

Figure 1:
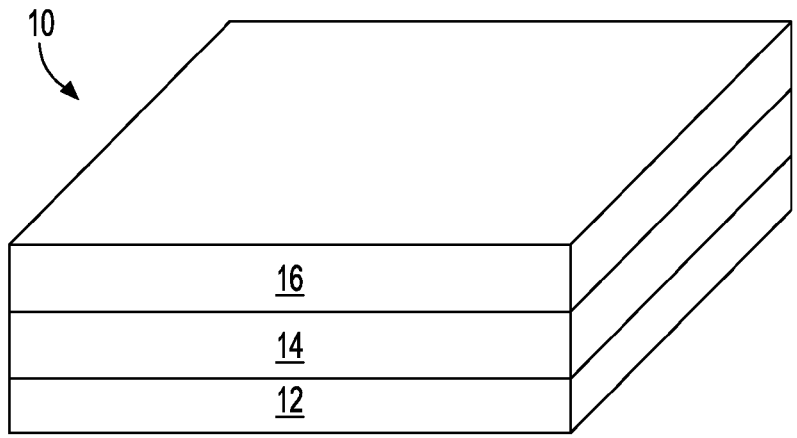
FIG. 1 is a perspective view depicting a semiconductor-on-insulator (SOI) substrate that can be employed in one embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

As stated above, the present disclosure provides non-planar semiconductor devices having reduced gate to drain coupling and thus reduced gate induced drain tunneling currents. The reduction in gate to drain coupling and gate induced drain tunneling currents is achieved in the present disclosure by providing at least one semiconductor nanowire having a tapered profile which widens from the source side of the device towards the drain side of the device. The term "non-planar" as used to describe a semiconductor device denotes devices formed in regions other than the top layer of the substrate.

In particular, the present disclosure provides semiconductor nanowire channel field effect transistors (FETs) that include at least one tapered semiconductor nanowire having a first semiconductor nanowire portion whose width is less than a second semiconductor nanowire portion, and a gate that fully or partially surrounds a third semiconductor nanowire portion of the tapered semiconductor nanowire which is located between the first and second semiconductor nanowire portions. Applicants have found that by having a tapered semiconductor nanowire in which the width of the semiconductor nanowire portion on the drain side of the gate is larger than the width of the semiconductor nanowire portion on the source side of the gate, a semiconductor device is provided that has reduced gate to drain coupling and thus reduced gate induced drain tunneling currents.

The channel of the semiconductor nanowire channel field effect transistors (FETs) of the present disclosure forms at the surface of a portion of the at least one semiconductor nanowire that is under the gate (or in the bulk of the nanowire when the nanowire has a diameter smaller than 5 nm). When the gate fully surrounds the at least one semiconductor nanowire, the non-planar semiconductor device can be referred to as a gate-all-around FET. When the gate partially surrounds the at least one semiconductor nanowire, as in the case when the at least one nanowire has a bottommost surface that is still attached to an underlying insulator layer, the non-planar semiconductor device can be referred to as an omega-gate FET. Although the description that follows illustrates the formation of only one type of non-planar semiconductor device (i.e., gate-all-around FET or omega-gate FET) on the surface of a substrate, the present disclosure also contemplates forming both types of devices on the surface of the same substrate. When both types of non-planar semiconductor devices are formed on a same substrate, block mask technology can be used to prevent the undercutting of the semiconductor nanowires in specific regions of the substrate.

Referring first to FIG. 1, there is illustrated a semiconductor-on-insulator (SOI) substrate 10 that can be employed in one embodiment of the present disclosure. The SOI substrate 10 includes a handle substrate 12, an insulator layer 14 and a semiconductor-on-insulator (SOI) layer 16.

The handle substrate 12 of the SOI substrate 10 includes a first semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the material of the handle substrate 12 can be a single crystalline, i.e., epitaxial, semiconductor material. The term "single crystalline" as used throughout the present disclosure denotes a material in which the crystal lattice of the entire sample is continuous and unbroken to the edges of the sample, with no grain boundaries. In one example, the handle substrate 12 can be a single crystalline silicon material.

All or portions of the handle substrate 12 can be doped to provide at least one globally or locally conductive region (not shown) located beneath the interface between the handle substrate 12 and the insulator layer 14. The dopant concentration in doped regions of the handle substrate 12 can be optimized for device performance. The thickness of the handle substrate 12 can be from 50 microns to 1 mm, although lesser and greater thicknesses can also be employed.

The insulator layer 14 of the SOI substrate 10, which is sandwiched between the handle substrate 12 and the SOI layer 16, may be referred to a buried insulator layer. The insulator layer 14 can be a semiconductor oxide, a semiconductor nitride, a semiconductor oxynitride, or any multilayered stack thereof. In some embodiments, the insulator layer 14 is a silicon oxide layer. In one embodiment, the insulator layer 14 of the SOI substrate 10 can have a thickness from 10 nm 30 to nm. In another embodiment, the insulator layer 14 of the SOI substrate 10 can have a thickness from 2 nm to 50 nm.

The SOI layer 16 of the SOI substrate 10 includes a second semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the second semiconductor material of the SOI layer 16 can be a single crystalline, i.e., epitaxial, semiconductor material. In one example, the second semiconductor material of the SOI layer 16 can be a single crystalline silicon material. In one embodiment, the second semiconductor material of the SOI layer 16 may be comprised of a same semiconductor material as that of the handle substrate 12. In another embodiment, the second semiconductor material of the SOI layer 16 may be comprised of a different semiconductor material as that of the handle substrate 12. In one embodiment, the thickness of the SOI layer 16 can be from 40 nm to 200 nm. In another embodiment, the thickness of the SOI layer 16 can be from 4 nm to 5000 nm.

In some embodiments in which the SOI layer 16 has a thickness that is outside one of the aforementioned ranges, the SOI layer 16 can be thinned to a desired thickness within one of the above mentioned ranges by planarization, grinding, wet etching, dry etching, oxidation followed by oxide etching, or any combination thereof. One method of thinning an SOI layer 16 is to oxidize the semiconductor material, such as silicon, by a thermal dry or wet oxidation process, and then wet etching the semiconductor oxide layer, such as silicon oxide, using a hydrofluoric (HF) acid mixture. This process can be repeated to achieve the desired thickness of the SOI layer 16.

In some embodiments of the present disclosure, the SOI substrate 10 can be formed by implanting a high-energy dopant such as, for example, oxygen into a bulk semiconductor substrate and then annealing the structure to form the insulator layer 14 of the SOI substrate 10. In another embodiment, the insulator layer 14 may be deposited or grown by thermal techniques prior to the formation of the SOI layer 16. In yet another embodiment, the SOI substrate 10 can be formed using a wafer-bonding technique. Examples of some known processes for fabricating an SOI substrate which can be employed in the present disclosure include Separation by Implanted OXygen (SIMOX) or wafer bonding using Smart-Cut™.

Figure 2:
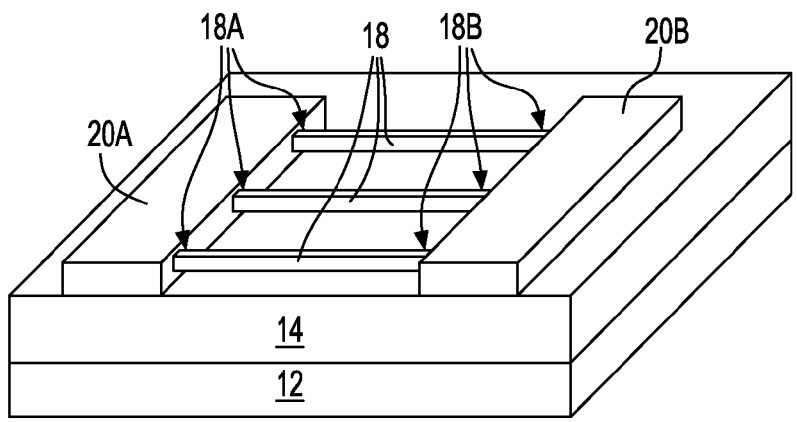
FIG. 2 is a perspective view of the SOI substrate shown in FIG. 1 after patterning an SOI layer of the semiconductor-on-insulator substrate to provide at least one semiconductor nanowire that has an end segment connected to a first SOI pad region and another end segment connected to a second SOI pad region.

Referring now to FIG. 2, there is illustrated the SOI substrate 10 shown in FIG. 1 after forming at least one semiconductor nanowire 18 that has an end segment 18A that is connected to a first SOI pad region 20A and another end segment 18B that is connected to a second SOI pad region 20B. The at least one semiconductor nanowire 18, the first pad region 20A and the second SOI pad region 20B are comprised of the same second semiconductor material as SOI layer 16. As shown, the at least one semiconductor nanowire 18 is orientated perpendicular relative to the orientation of the first and second SOI pad regions 20A, 20B.

The structure shown in FIG. 2 can be formed by patterning the SOI layer 16 utilizing lithography, followed by an etch process such as, for example, reactive ion etching (RIE). The lithographic step can include forming a photoresist (not shown) atop the SOI layer 16, exposing the photoresist to a desired pattern of radiation and then developing the exposed photoresist utilizing a conventional resist developer. The etch process that is employed in the present disclosure is selective so it preferentially removes exposed portions of the SOI layer 16 but not the underlying insulator layer 14. In some embodiments, a reactive ion etch utilizing hydrogen bromide (HBr) can be employed. Typically, a slab comprising a portion of the SOI layer is first formed (by lithography and etching) and a second sequence of lithography and etching is used to pattern the slab into the structure shown in FIG. 2 which includes at least one semiconductor nanowire 18 and the first and second SOI pad regions 20A, 20B.

Figure 3A:
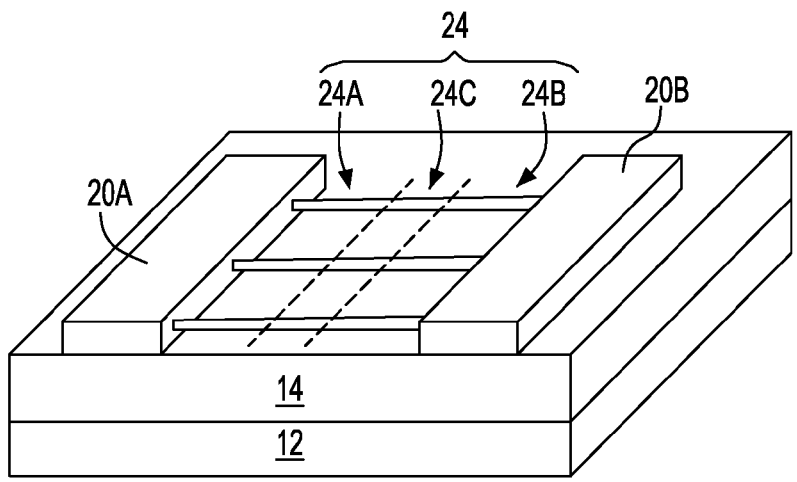
FIG. 3A is a perspective view of the structure of FIG. 2 after forming at least one tapered semiconductor nanowire from the at least one semiconductor nanowire, wherein the at least one tapered semiconductor nanowire includes a first semiconductor nanowire portion having a first width, a second semiconductor nanowire portion having a second width and a third semiconductor nanowire portion having a third width, wherein the third semiconductor nanowire portion is located between the first and second semiconductor nanowire portions, and wherein the first width is less than the third width, and the third width is less than the second width.
Figure 3B:
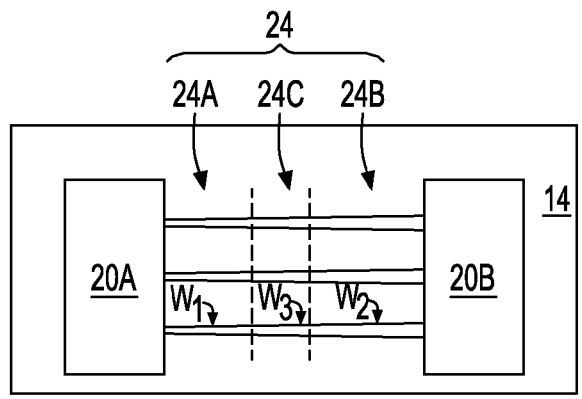
FIG. 3B is a top down view of the structure shown in FIG. 3A.

Referring now to FIG. 3A and FIG. 3B, there are illustrated the structure of FIG. 2 after at least one tapered semiconductor nanowire 24 is formed from the at least one semiconductor nanowire 18. The at least one tapered semiconductor nanowire 24 that is formed has a width that continuously increases/decreases from one end segment to another end segment. The at least one tapered semiconductor nanowire 24 includes a first semiconductor nanowire portion 24A having a first width $w_1$, a second semiconductor nanowire 24B portion having a second width $w_2$ and a third nanowire semiconductor portion 24C having a third width $w_3$. In the drawings, dotted lines are provided to highlight the various portions of the at least one tapered semiconductor nanowire 24.

As is shown, the third semiconductor nanowire portion 24C is located between and is in direct contact with the first semiconductor nanowire portion 24A and the second semiconductor nanowire portion 24B. Also, and as shown in FIG. 3B, the first width $w_1$ is less than the third width $w_3$, and the third width $w_3$ is less than the second width $w_2$. As such, the at least one tapered semiconductor nanowire 24 that is formed has a width at one portion, which is nearest to the second semiconductor-on-insulator pad region 20B, that is greater than the width of the other end of the at least one tapered semiconductor nanowire 24, which is nearest to the first semiconductor-on-insulator pad region 20A.

In one embodiment, the first width $w_1$ of the first semiconductor nanowire portion 24A has a width from 5 nm to 10 nm, the third width $w_3$ of the third semiconductor nanowire portion 24C has a width from 7 nm to 15 nm, the second width $w_2$ of the second semiconductor nanowire portion 24B has a width from 10 nm to 20 nm. In another embodiment, the first width $w_1$ of the first semiconductor nanowire portion 24A has a width from 3 nm to 30 nm, the third width $w_3$ of the third semiconductor nanowire portion 24C has a width from 5 nm to 45 nm, the second width $w_2$ of the second semiconductor nanowire portion 24B has a width from 20 nm to 50 nm. Other widths that are greater than or lesser than the ranges provided above can also be employed so long as the semiconductor nanowire that is formed has a tapered profile as defined above.

In one embodiment, the forming of the at least one tapered semiconductor nanowire 24 from the at least one semiconductor nanowire 18 comprises selective removal of semiconductor material from a portion of the at least one semiconductor nanowire 18 that is located nearest to the first semiconductor-on-insulator pad region 20A relative to at least another portion of the at least one semiconductor nanowire 18 that is located nearest the second semiconductor-on-insulator pad region 20B, and annealing. The selective removal can be performed by subjecting a preselected portion of the at least one semiconductor nanowire 18 to a high temperature (greater than 700° C.) oxidation followed by etching of the grown oxide. The oxidation and etching can be repeated on the preselected portion of the at least one semiconductor nanowire to provide a desired dimension to the preselected portion of the at least one semiconductor nanowire 18.

The anneal used in this embodiment of the present disclosure serves to smooth the at least one tapered semiconductor nanowire 24 providing an elliptical shape or a cylindrical shape to the tapered semiconductor nanowire 24. This anneal can be performed in hydrogen. In one embodiment, the anneal employed in the present disclosure can be performed in hydrogen at a temperature from 600° C. to 1000° C. The pressure of hydrogen used during the anneal can range from 7 torr to 600 torr.

In another embodiment, the forming of the at least one tapered semiconductor nanowire 24 from the at least one semiconductor nanowire 18 comprises forming a mask on a portion of the at least one semiconductor nanowire 18 that is located nearest the second semiconductor-on-insulator pad region 20B, annealing and removing the mask. The mask, which is not shown in the drawings, can be comprised of a hard mask material such as an oxide, nitride and/or oxynitride. When a hard mask is employed, the hard mask can be formed by deposition or a thermally process, followed by lithography and etching. The etch used in this point of the present disclosure selectively removes exposed portions of the hard mask material. With the hard mask in place, the exposed portion of the at least one semiconductor nanowire 18 that is nearest the first SOI pad region 20A is annealed in hydrogen. The annealing serves to smooth the semiconductor nanowire by removing semiconductor material from an outer surface thereof providing a semiconductor portion, i.e., the first semiconductor portion 24A, whose width is less than the width of remaining portions of the at least one semiconductor nanowire 18 that were protected by the mask. In one embodiment, the anneal employed in the present disclosure can be performed in hydrogen at a temperature from 600° C. to 1000° C. The pressure of hydrogen used during the anneal can range from 7 torr to 600 torr. Following the anneal, the mask is removed utilizing a conventional stripping process and a resultant semiconductor nanowire which is tapered is formed.

In a further embodiment, the initial patterning step, particularly the lithographic step, used in defining the at least one semiconductor nanowire can induce a strain in the SOI material that results in curvature of the at least one semiconductor nanowire. In this embodiment, the strain that is induced by the initial patterning step can directly form a tapered semiconductor nanowire 24 as defined hereinabove without having to first form a non-tapered semiconductor nanowire. In some embodiments, the tapered semiconductor nanowires 24 that are formed from the initial patterning step can be annealed to smooth the at least one tapered semiconductor nanowire 24 providing an elliptical shape or a cylindrical shape to the tapered semiconductor nanowire 24. When such an anneal is performed, the anneal is typically preformed in hydrogen. In one embodiment, the anneal employed in the present disclosure can be performed in hydrogen at a temperature from 600° C. to 1000° C. The pressure of hydrogen used during the anneal can range from 7 torr to 600 torr.

In one embodiment, the initial patterning step using optical lithography can be used to directly form a tapered semiconductor nanowire. In another embodiment, the initial patterning step that can be used to directly form a tapered semiconductor nanowire comprises electron beam (E-beam) lithography. In E-beam lithography, individual spots (pixels) are defined in the resist. This would enable forming a tapered wire structure as more pixels can be written towards the drain side of the device, and in subsequent anneal processes, this would smooth out to a tapered wire structure.

Figure 4:
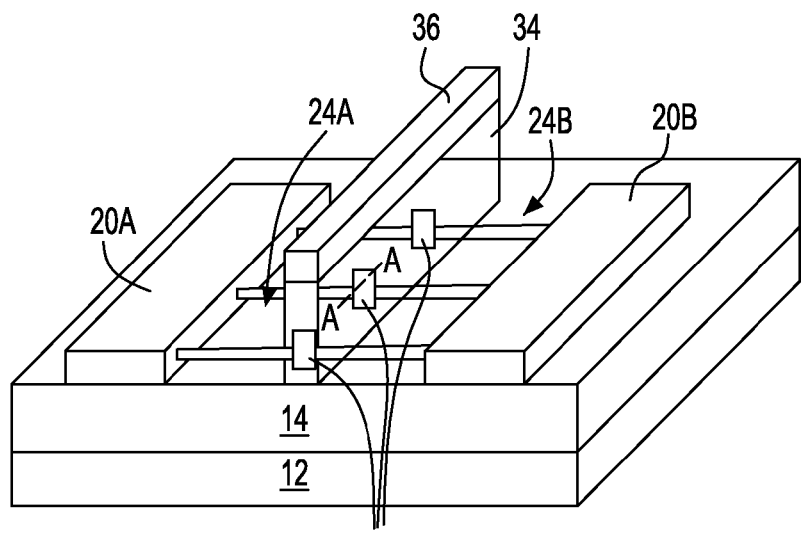
FIG. 4 is a perspective view of the structure of FIG. 3A after gate formation atop the third semiconductor nanowire portion, wherein after gate formation the first semiconductor nanowire portion is located on a first side of the gate and the second semiconductor nanowire is located on a second side of the gate.

FIG. 4 is a perspective view of the structure of FIG. 3A after gate formation atop the third semiconductor nanowire portion 24C. After gate formation, the first semiconductor nanowire portion 24A is located on a first side of the gate and the second semiconductor nanowire 24B which is wider than the first semiconductor nanowire portion 24A is located on a second side of the gate.

Specifically, FIG. 4 illustrates a gate 26 that is formed on the third semiconductor nanowire portion 24C of each tapered semiconductor nanowire 24. The structure shown in FIG. 4 also includes a polysilicon line 34 that caps each of the gates 26 and a hard mask line 36 that is located atop the polysilicon line 34. Although a single gate 26 is shown on each tapered semiconductor nanowire 24, a plurality of gates 26 can be formed on each tapered semiconductor nanowire 24.

The structure shown in FIG. 4 is formed by first depositing blanket layers of the various material layers of gate 26 (to be described in greater detail herein below) on the entire structure shown in FIG. 3. Then, a blanket layer of polysilicon is formed atop the various layers of the gate 26, and thereafter a blanket layer of hard mask material is formed on the entire surface of the blanket layer of polysilicon. The entire material stack including the materials layers of the gate 26, the blanket layer of polysilicon, and blanket layer of hard mask material, is then patterned by lithography and etching providing the structure shown in FIG. 4. The etch used in forming the structure shown in FIG. 4 may comprise a dry etching process such as, for example, reactive ion etching, plasma etching, or ion beam etching.

Figure 5:
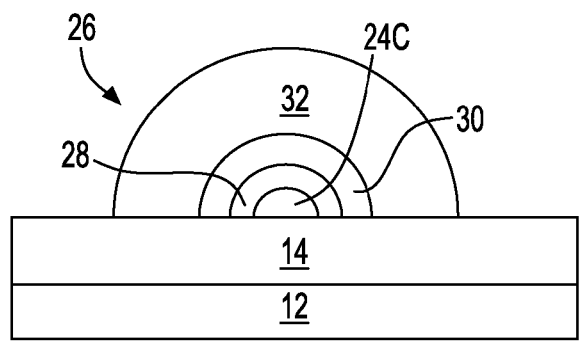
FIG. 5 is a cross sectional view of the gate along the line A-A shown in FIG. 4.

Each gate 26, as shown, for example, in FIG. 5, may comprise a first dielectric material 28, an optional second dielectric material 30, and a metal gate film 32. It is noted that the third semiconductor nanowire portion 24C of the tapered semiconductor nanowire 24 that is directly beneath the gate 26 serves as a channel of the semiconductor nanowire FET of the present disclosure. The first dielectric material 28 may comprise a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof.

Each value of x is independently from 0.5 to 3 and each value of y is independently from 0 to 2.

The first dielectric material 28 can be formed by any conventional technique including, for example, deposition or thermal growth, which is well known to those skilled in the art. In one embodiment of the present disclosure, the first dielectric material 28 has a thickness in a range from 1 nm to 10 nm.

The optional second dielectric material 30 may comprise one of the dielectric materials mentioned above for the first dielectric material 28. In one embodiment, the optional second dielectric material 30 is comprised of a same dielectric material as the first dielectric material 28. In another embodiment, the optional second dielectric material 30 is comprised of a different dielectric material as the first dielectric material 28. For example, and in this embodiment, the first dielectric material 28 may comprise silicon oxide, while the optional second dielectric material 30 may comprise a high k gate dielectric such as, for example, $HfO_2$. The optional second dielectric material 30 can be formed utilizing one of the techniques mentioned above in forming the first dielectric material 28. In one embodiment, the thickness of the optional second dielectric 30 may be in a range from 1 nm to 3 nm.

The metal gate film 32 that is formed may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The metal gate film 32 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the metal gate film 32 has a thickness from 1 nm to 100 nm.

As stated above, a blanket layer of polysilicon is then formed atop the metal gate film 32 utilizing techniques well known in the art. The blanket layer of polysilicon which is subsequently patterned into polysilicon line 34 can be doped within an appropriate impurity by utilizing either an in-situ doping deposition process or by utilizing deposition, followed by a step such as ion implantation or gas phase doping in which the appropriate impurity is introduced into the blanket layer of polysilicon.

After forming the blanket layer of polysilicon, a blanket layer of a hard mask material is formed atop the blanket layer of polysilicon. The hard mask material may comprise a semiconductor oxide, a semiconductor nitride, a semiconductor oxynitride or any multilayered stack thereof can be used. In one embodiment, the hard mask material employed is silicon nitride. The blanket layer of hard mask material can be formed utilizing any conventional deposition process or thermal growth process that is well known to those skilled in the art.

After formation of the gate 26 atop the third semiconductor nanowire portion 24C, the first semiconductor portion 24A is located on a first side of the gate, while the second semiconductor portion 24B is formed on a second side of the gate that is opposite the first side. In accordance with the present disclosure, a drain region will be subsequently formed on the second side of the gate, while a source region will be subsequently formed on the first side of the gate.

Figure 6:
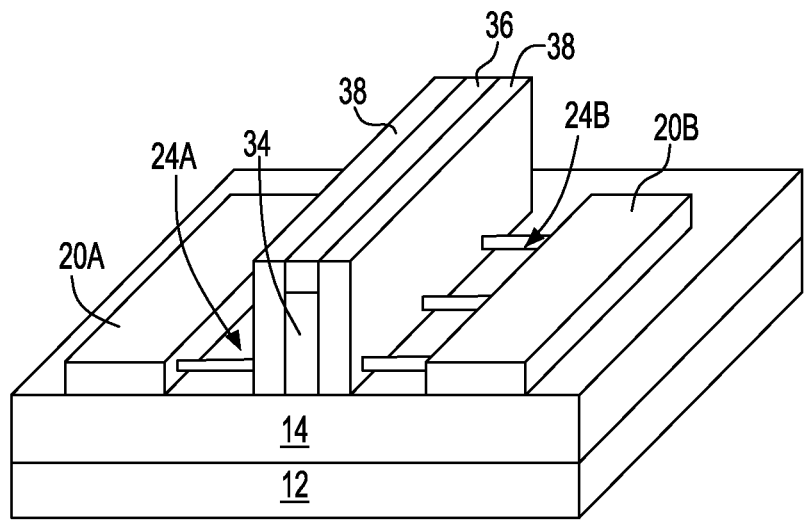
FIG. 6 is a perspective view of the structure of FIG. 4 after spacer formation.

Referring now to FIG. 6, there is illustrated the structure of FIG. 4 after spacer 38 formation. As is shown, the spacer 38 is formed on opposing sides of the polysilicon line 34 and on portions of each tapered semiconductor nanowire 24 that are not covered by the gate. The spacer 38 can be formed by depositing a blanket dielectric film such as silicon nitride and then etching the dielectric film from all horizontal surfaces. In one embodiment, a reactive ion etch can be used in forming the spacer 38.

Figure 7:
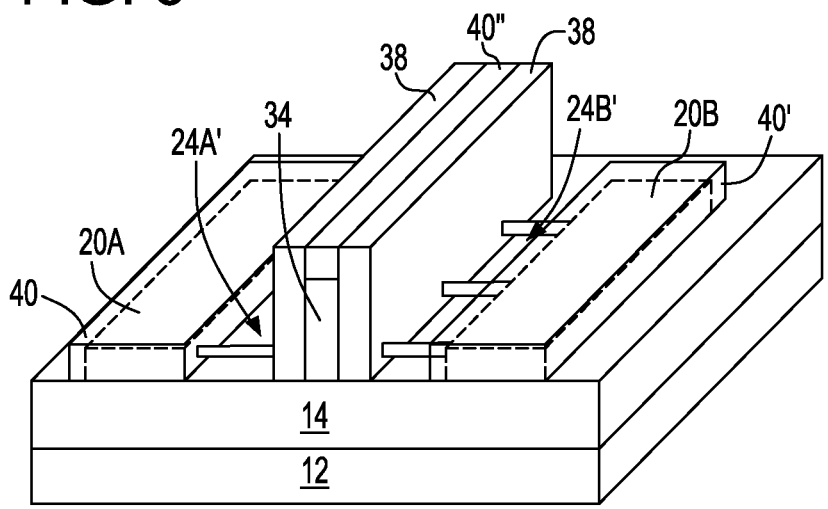
FIG. 7 is a perspective view of the structure of FIG. 6 after formation of a source region and a drain region.

Referring now to FIG. 7, there is illustrated the structure of FIG. 6 after formation of a source region on the first side of the gate including the first SOI pad region 20A and remaining first semiconductor nanowire portion 24A and a drain region on the second side of the gate including the SOT pad region 20B and remaining second semiconductor nanowire portion 24B.

The source and drain regions are formed by a selective epitaxial growth process that thickens the exposed nanowire surfaces forming a first thickened semiconductor nanowire portion 24A' and a second thickened semiconductor nanowire portion 24B' which are not covered by the gate and spacers. The epitaxial growth also thickens the SOT pad regions 20A, 20B. In some embodiments, the hard mask line 36 is removed from the polysilicon line 34 prior to selective epitaxial growth utilizing a conventional stripping process. In such an embodiment and as shown in FIG. 7, an epitaxial semiconductor layer 40" forms atop the polysilicon line 34.

In the drawing, reference numeral 40 denotes the epitaxial semiconductor layer that is formed atop the first pad region 20A, while numeral 40' denotes the epitaxial semiconductor layer that is formed atop the first pad region 20B. In accordance with the present disclosure the source region includes epitaxial semiconductor layer 40 as well as the first thickened semiconductor nanowire portion 24A', while the drain region includes epitaxial semiconductor layer 40' as well as the second thickened semiconductor nanowire portion 24B'.

The epitaxial growth may merge the adjacent semiconductor portions together. In one embodiment, the thickened/merged nanowire portions 24A', 24B' and SOI pad regions 20A, 20B are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCl. The use of chlorine allows selective deposition of silicon only on exposed silicon surfaces. A precursor for SiGe may be $GeH_4$, which may obtain deposition selectivity without HCl. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figure 8:
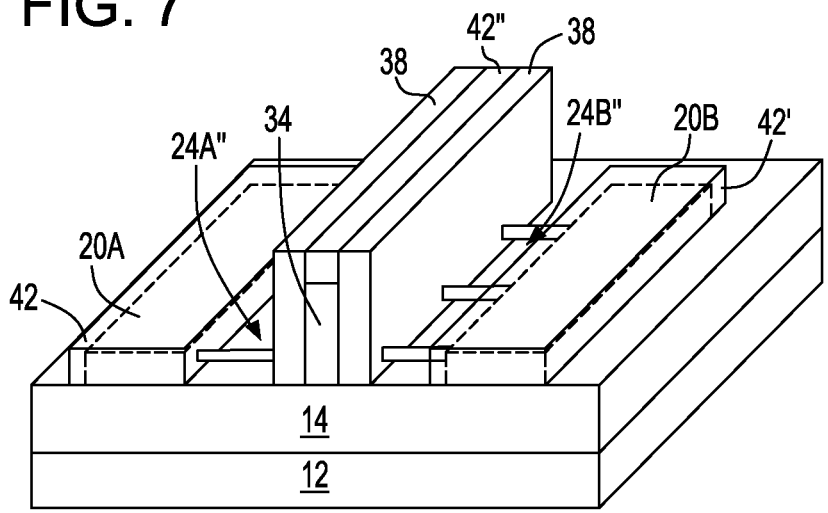
FIG. 8 is a perspective view of the structure of FIG. 7 after formation of a metal semiconductor alloy layer atop the source region and the drain region.

Referring now to FIG. 8, there is illustrated the structure of FIG. 7 after formation of a metal semiconductor alloy layer atop the source region and the drain region. The metal semiconductor alloy layer can be formed by first depositing a metal semiconductor alloy forming metal such as for example, Ni, Pt, Co, and alloys such as NiPt, on the surface of the epitaxial grown semiconductor layer including layers 40, 40', 40", 24A' and 24B'. An anneal is then performed that causes reaction between the metal semiconductor alloy forming metal and the epitaxial semiconductor layer. After annealing, any unreactive metal can be removed. When Ni is used the NiSi phase is formed due to its low resistivity. For example, formation temperatures include 400° C.-600° C. In the drawing, reference numerals 42 and 42' denote a metal semiconductor alloy that is formed atop the first and second SOI pads 20A and 20B, respectively, reference numeral 24A" denotes the metal semiconductor alloy that is formed on the first thickened semiconductor nanowire portion 24A', and reference numeral 24B" denotes the metal semiconductor alloy that is formed on the second thickened semiconductor nanowire portion 24B'. In embodiments in which the hard mask line 36 was removed, a metal semiconductor alloy layer 42" can form atop the polysilicon line 34, as is shown in FIG. 7.

Once the metal semiconductor alloy layer is formed, capping layers and vias for connectivity (not shown) may be formed.

Figure 9:
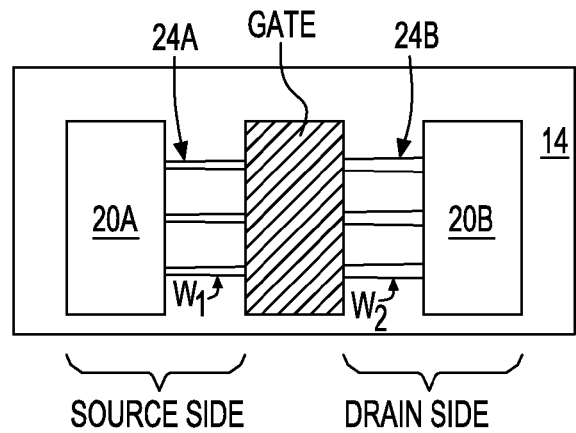
FIG. 9 is a top down view illustrating at least one tapered semiconductor nanowire that has a portion located on a drain side of the gate that is wider relative to another portion of the at least one tapered semiconductor nanowire that is located on the source side of the gate.

Referring now to FIG. 9, there is illustrated a top down view of the basic concept of the present disclosure including at least one tapered semiconductor nanowire that has a portion 24B located on a drain side of the gate that is wider relative to another portion of the at least one semiconductor nanowire 24A that is located on the source side of the gate.

Reference is now made to FIGS. 10-16 which illustrate another embodiment of the present disclosure. This another embodiment of the present disclosure is similar to the embodiment described above and illustrated in FIGS. 1-9 except that the tapered semiconductor nanowires are suspended.

Figure 10:
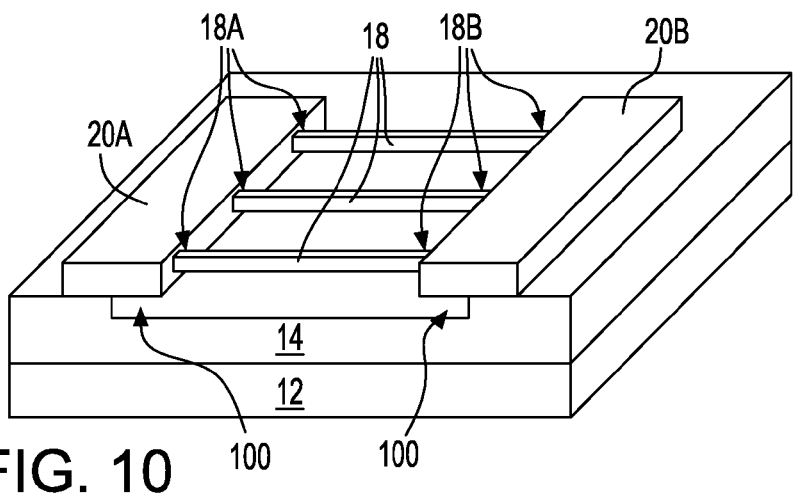
FIG. 10 is a perspective view of the structure of FIG. 2 after suspending the at least one semiconductor nanowire.

This embodiment of the present disclosure begins by providing an SOI substrate 10 as shown in FIG. 1 and then patterning the SOI substrate to provide the structure illustrated in FIG. 2. After forming the structure shown in FIG. 2, the insulator layer 14 located beneath each of the at least one semiconductor nanowires 18 and portions of the first and SOI pad regions 20A, 20B are removed providing the structure shown in FIG. 10. In FIG. 10, reference numeral 100 denotes an undercut that is formed beneath each of the first and second SOI pad regions 20A, 20B. The portion of the insulator layer 14 located beneath each of the at least one semiconductor nanowires 18 and portions of the first and SOI pad regions 20A, 20B can be removed utilizing an isotropic etching process. In one embodiment of the present disclosure, the isotropic etching may be, for example, performed using a diluted hydrofluoric acid (DHF). In one embodiment, a 100:1 DHF etches approximately 2 to 3 nm of a buried oxide layer per minute at room temperature.

As shown in FIG. 10, the insulator layer 14 is recessed in regions not covered by the SOI pad regions 20A, 20B. The isotropic etching results in the lateral etching of portions of the insulator layer 14 that are under the SOI pad regions 20A, 20B. The lateral etch thus suspends the at least one semiconductor nanowire 18 above the remaining portion of the insulator layer 14.

Figure 11A:
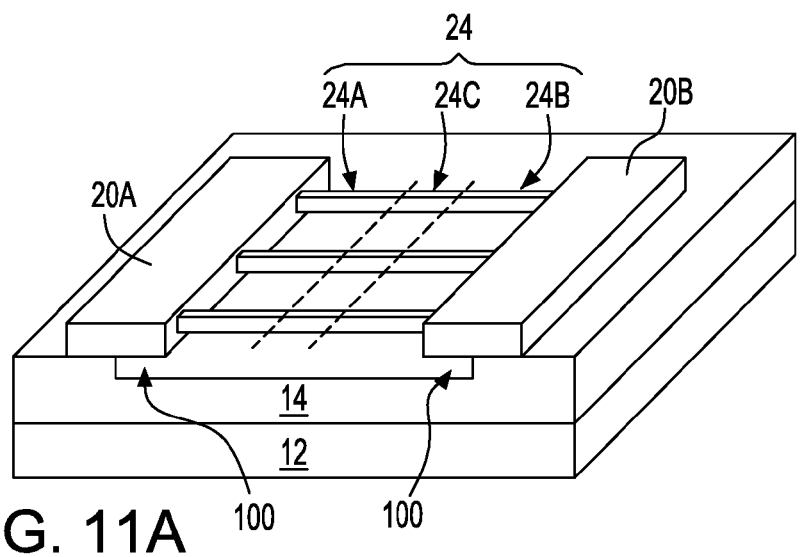
FIG. 11A is a perspective view of the structure of FIG. 10 after forming at least one tapered semiconductor nanowire from the at least one semiconductor nanowire, wherein the at least one tapered semiconductor nanowire includes a first semiconductor nanowire portion having a first width, a second semiconductor nanowire portion having a second width and a third semiconductor nanowire portion having a third width, wherein the third semiconductor nanowire portion is located between the first and second semiconductor nanowire portions, and wherein the first width is less than the third width, and the third width is less than the second width.
Figure 11B:
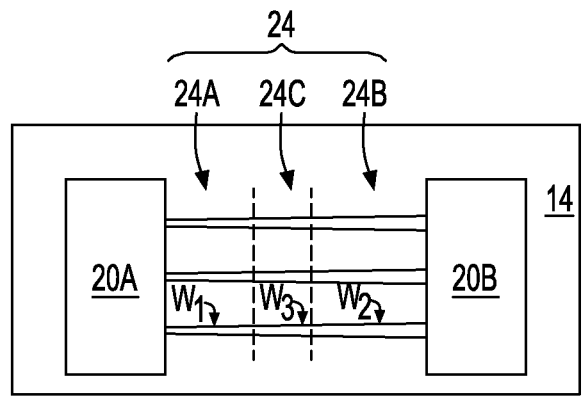
FIG. 11B is a top-down view of the structure shown in FIG. 11A.

Referring now to FIGS. 11A-11B, there are illustrated the structure shown in FIG. 10 after converting each of the semiconductor nanowires 18 into a tapered semiconductor nanowire 24. Each tapered semiconductor nanowire 24 includes a first semiconductor nanowire portion 24A having a first width, a second semiconductor nanowire portion 24B having a second width and a third semiconductor nanowire portion 24C having a third width, wherein the third semiconductor nanowire portion 24C is located between the first and second semiconductor nanowire portions 24A, 24B, and wherein the first width is less than the third width, and the third width is less than the second width.

The tapered semiconductor nanowires 24 can be formed utilizing one of the techniques mentioned above in forming the tapered semiconductor nanowires 24 of the previously discussed embodiment of the present disclosure. In the case in which the initial patterning step provides tapered semiconductor nanowires, the above mentioned isotropic etch is performed directly to such a structure suspending the tapered semiconductor nanowires.

Figure 12:
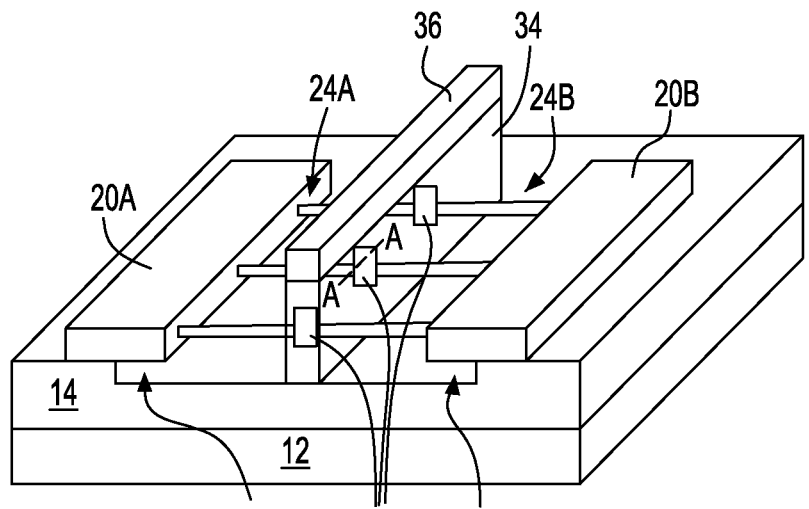
FIG. 12 is a perspective view of the structure of FIG. 11A after gate formation atop the third semiconductor nanowire portion, wherein after gate formation the first semiconductor nanowire portion is located on a first side of the gate and the second semiconductor nanowire is located on a second side of the gate.

Referring now to FIG. 12, there is illustrated the structure shown in FIG. 11A after formation of gate 26, polysilicon line 34 and hard mask 36. After gate formation, the first semiconductor nanowire portion 24A is located on a first side of the gate 26 and the second semiconductor nanowire 24B is located on a second side of the gate 26. The structure shown in FIG. 12 is formed utilizing the same basic processing steps as used in describing the formation of the structure shown in FIG. 4 except that the gate 26 wraps fully around the third semiconductor portion 24C of the tapered semiconductor nanowire. This is clearly shown in FIG. 13.

Figure 13:
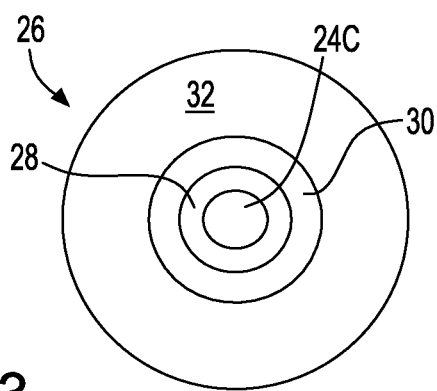
FIG. 13 is a cross sectional view of the gate along the line A-A shown in FIG. 12.
Figure 14:
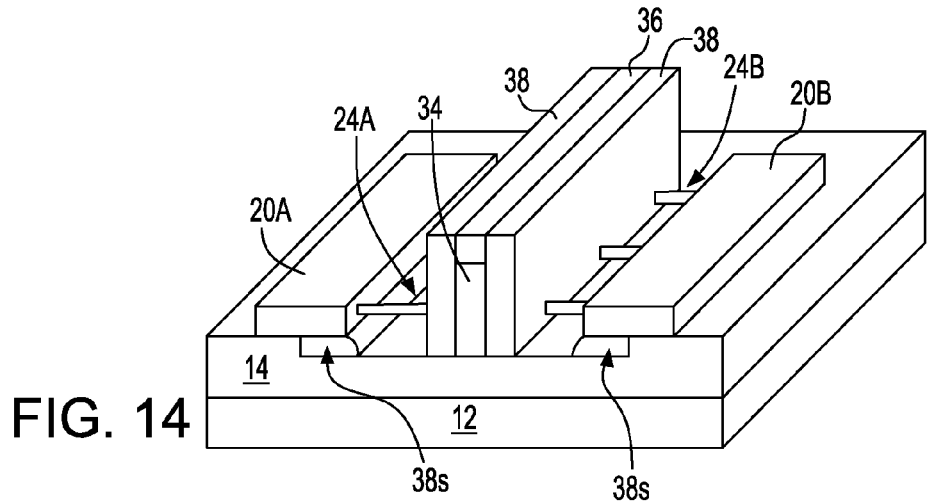
FIG. 14 is a perspective view of the structure of FIG. 13 after spacer formation.

Referring now to FIG. 14, there is shown the structure of FIG. 13 after spacer 38 formation. The spacer 28 is formed as described above in connection with FIG. 6. In this embodiment, however, a spacer portion 38s forms in the undercut regions 100.

Figure 15:
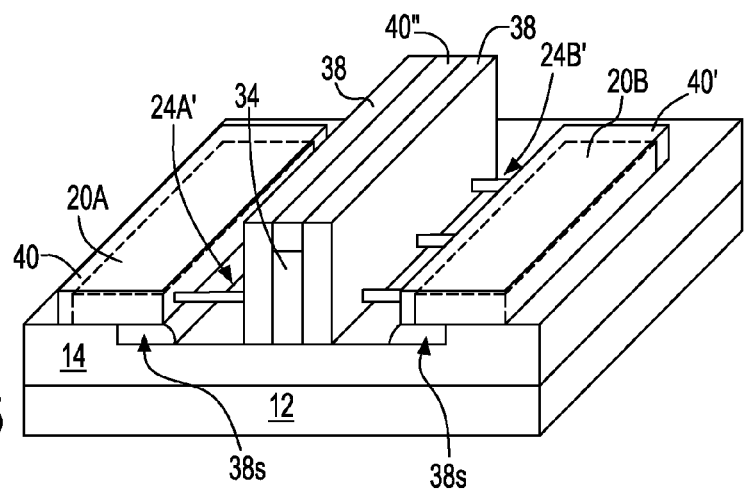
FIG. 15 is a perspective view of the structure of FIG. 14 after formation of the source region and the drain region.

Referring now to FIG. 15, there is illustrated the structure of FIG. 14 after formation of the source region and the drain region. The source and drain regions are formed via epitaxy as described above in connection with the structure shown in FIG. 7 of the present disclosure.

Figure 16:
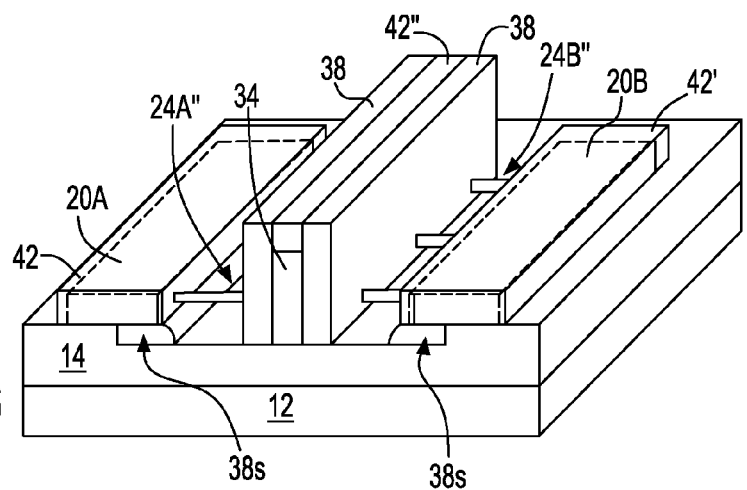
FIG. 16 is a perspective view of the structure of FIG. 16 after formation of a metal semiconductor alloy layer atop the source region and the drain region.

Referring now to FIG. 16, there is illustrated the structure of FIG. 15 after formation of a metal semiconductor alloy layer atop the source region and the drain region. The metal semiconductor alloy layer is formed as described above in connection with the structure shown in FIG. 8 of the present disclosure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A non-planar semiconductor device comprising:
at least one tapered semiconductor nanowire having a curved top surface and a curved bottom surface and located atop an insulator layer of a semiconductor-on-insulator substrate, wherein an end segment of said at least one tapered semiconductor nanowire is attached to a first semiconductor-on-insulator pad region and another end segment of said at least one tapered semiconductor nanowire is attached to a second semiconductor-on-insulator pad region, said first and second semiconductor-on-insulator pad regions are both located atop said insulator layer;
a gate located on a portion of said at least one tapered semiconductor nanowire;
a polysilicon line located on a surface of said gate and having a bottommost surface in contact with a surface of said insulator layer;
a hard mask line located on an uppermost surface of said polysilicon line;
a source region located on a first side of the gate; and
a drain region located on a second side of the gate which is opposite said first side of the gate, wherein said at least one tapered semiconductor nanowire comprises a first semiconductor nanowire portion having a first width located on the first side of the gate and a second semiconductor nanowire portion having a second width that is located on the second side of the gate, wherein said second width is greater than the first width.

2. A non-planar semiconductor device comprising:

at least one tapered semiconductor nanowire located atop an insulator layer of a semiconductor-on-insulator substrate, wherein an end segment of said at least one tapered semiconductor nanowire is attached to a first semiconductor-on-insulator pad region and another end segment of said at least one tapered semiconductor nanowire is attached to a second semiconductor-on-insulator pad region, said first and second semiconductor-on-insulator pad regions are both located atop said insulator layer;

a gate located on a portion of said at least one tapered semiconductor nanowire, wherein said gate comprises at least one gate dielectric material and a metal gate film;

a polysilicon line straddling said gate and having a bottommost surface in contact with a surface of said insulator layer;

a hard mask line located on an uppermost surface of said polysilicon line;

a source region located on a first side of the gate; and a drain region located on a second side of the gate which is opposite said first side of the gate, wherein said at least one tapered semiconductor nanowire comprises a first semiconductor nanowire portion having a first width located on the first side of the gate and a second semiconductor nanowire portion having a second width that is located on the second side of the gate, wherein said second width is greater than the first width.

3. The non-planar semiconductor device of claim 1, wherein said at least one tapered semiconductor nanowire is suspended above said insulator layer of said semiconductor-on-insulator substrate and wherein a portion of said first and second semiconductor-on-insulator pads are suspended above said insulator layer.

4. The non-planar semiconductor device of claim 1, wherein said portion of said at least one tapered semiconductor nanowire that is beneath the gate is a third semiconductor nanowire portion of the at least one tapered semiconductor nanowire that is positioned between and in direct contact with both the first and second semiconductor nanowire portions.

5. The non-planar semiconductor device of claim 4, wherein said third semiconductor nanowire portion has a third width that is greater than the first width, yet smaller than the second width.

6. The non-planar semiconductor device of claim 4, wherein said third semiconductor nanowire portion of said at least one tapered semiconductor nanowire forms a channel of said non-planar semiconductor device.

7. The non-planar semiconductor device of claim 1, further comprising a spacer located on each side of the gate.

8. The non-planar semiconductor device of claim 1, wherein said source region and said drain region comprise an epitaxially semiconductor material located atop said first and second semiconductor-on-insulator pad regions, and exposed surfaces of the first semiconductor nanowire portion and the second semiconductor nanowire portion.

9. The non-planar semiconductor device of claim 1, wherein a metal semiconductor alloy material is located atop said source region, said drain region, said first semiconductor-on-insulator pad region and said second semiconductor-on-insulator pad region.

10. The non-planar semiconductor device of claim 1, wherein said gate comprises a gate stack including at least one gate dielectric material and a metal gate film located atop the at least one gate dielectric material.

11. The non-planar semiconductor device of claim 1, further comprising an epitaxial semiconductor material located on an uppermost surface of said polysilicon line.

12. The non-planar semiconductor device of claim 10, wherein said at least one gate dielectric material includes a first gate dielectric material and a second gate dielectric material.

13. The non-planar semiconductor device of claim 2, wherein said at least one tapered semiconductor nanowire has a bottommost surface that is in direct contact with said insulator layer of said semiconductor-on-insulator substrate.

14. The non-planar semiconductor device of claim 2, further comprising an epitaxial semiconductor material located on an uppermost surface of said polysilicon line.

15. A non-planar semiconductor device comprising:

at least one tapered semiconductor nanowire suspended above an insulator layer of a semiconductor-on-insulator substrate, wherein an end segment of said at least one tapered semiconductor nanowire is attached to a first semiconductor-on-insulator pad region and another end segment of said at least one tapered semiconductor nanowire is attached to a second semiconductor-on-insulator pad region, each of said first and second semiconductor-on-insulator pad regions has a first bottommost surface portion located on a surface of said insulator layer and a second bottommost surface portion separated from said insulating layer by an undercut region;

a gate located on a portion of said at least one tapered semiconductor nanowire;

a first spacer portion located on each side of the gate, and a second spacer portion located in each undercut region, wherein a topmost surface of said second spacer portion within each undercut region directly contacts said second bottommost surface portion of said first and second semiconductor-on-insulator pad regions;

a source region located on a first side of the gate; and a drain region located on a second side of the gate which is opposite said first side of the gate, wherein said at least one tapered semiconductor nanowire comprises a first semiconductor nanowire portion having a first width located on the first side of the gate and a second semiconductor nanowire portion having a second width that is located on the second side of the gate, wherein said second width is greater than the first width.

16. The non-planar semiconductor device of claim 15, further comprising a polysilicon line located on a surface of said gate and having a bottommost surface in contact with a surface of said insulator layer.

17. The non-planar semiconductor device of claim 16, further comprising a material selected from a hard mask line or an epitaxial semiconductor located on a surface of said polysilicon line, wherein an uppermost surface of said material is coplanar with an uppermost surface of said first spacer portion.

* * * * *